United States Patent
Wahl

(10) Patent No.: US 6,871,050 B2
(45) Date of Patent: Mar. 22, 2005

(54) CIRCUIT CONFIGURATION FOR CONTROLLING THE TRANSMITTING POWER OF A BATTERY-OPERATED TRANSCEIVER

(75) Inventor: Martin Wahl, München (DE)

(73) Assignee: Infineon Technologies AG, Munich (DE)

( * ) Notice: Subject to any disclaimer, the term of this patent is extended or adjusted under 35 U.S.C. 154(b) by 442 days.

(21) Appl. No.: 09/767,383

(22) Filed: Jan. 22, 2001

(65) Prior Publication Data

US 2001/0048292 A1 Dec. 6, 2001

(30) Foreign Application Priority Data

Jan. 21, 2000 (DE) ......................................... 100 02 523

(51) Int. Cl.[7] ............................................. H01Q 11/12
(52) U.S. Cl. ................. 455/127.2; 455/126; 455/127.1; 455/574; 375/345
(58) Field of Search ................................ 455/572–574, 455/571, 575, 550, 126, 69, 582, 341, 219, 343, 115.3, 575.1, 550.1; 340/7.32, 636.1, 661, 825.25, 573.1, 572.1, 686.6; 320/127, 135, 131, 132, 152, 162, 163; 375/345, 130

(56) References Cited

U.S. PATENT DOCUMENTS

| | | | | |
|---|---|---|---|---|
| 4,267,467 A | * | 5/1981 | Tsukada | ...................... 307/597 |
| 4,709,404 A | * | 11/1987 | Tamura et al. | ............... 455/126 |
| 5,095,308 A | * | 3/1992 | Hewitt | ................... 340/825.44 |
| 5,201,063 A | | 4/1993 | Tam et al. | |
| 5,774,797 A | | 6/1998 | Kawano et al. | |
| 5,896,261 A | | 4/1999 | Black | |
| 6,018,232 A | * | 1/2000 | Nelson et al. | ............... 320/127 |
| 2002/0028701 A1 | * | 3/2002 | Satoh et al. | ................. 455/574 |

FOREIGN PATENT DOCUMENTS

| | | |
|---|---|---|
| JP | 62 286 324 | 12/1987 |
| JP | 2 305 118 | 12/1990 |
| JP | 5 252 660 | 9/1993 |
| JP | 6 260 958 | 9/1994 |
| JP | 7-46033 | 10/1995 |
| JP | 10 022 758 | 8/1998 |

* cited by examiner

*Primary Examiner*—Edward F. Urban
*Assistant Examiner*—Charles Chow
(74) *Attorney, Agent, or Firm*—Laurence A. Greenberg; Werner H. Stemer; Gregory L. Mayback

(57) ABSTRACT

A circuit configuration is provided for controlling the transmitting power of a battery-operated transceiver. A high transmitting power of a mobile transceiver generates a high voltage drop across an internal impedance of the battery which can lead to the device switching off. A reduction in the transmitting power in dependence on the battery voltage is therefore proposed. The battery voltage is thus compared with a reference voltage and a signal representing a nominal transmitting power is correspondingly corrected. The circuit can be integrated in a simple manner with analog components in an IC.

7 Claims, 2 Drawing Sheets

CIRCUIT CONFIGURATION FOR CONTROLLING THE TRANSMITTING POWER OF A BATTERY-OPERATED TRANSCEIVER

BACKGROUND OF THE INVENTION

Field of the Invention

The invention relates to a circuit configuration for controlling the transmitting power of a battery-operated transceiver having a battery for providing a supply voltage and a power stage for the controllable amplification of a radio-frequency signal.

Mobile transceivers, especially cellular digital mobile telephones, are supplied with voltage by a battery. The higher the transmitting power of the mobile telephone, the higher the current drawn from the battery. The current flowing through the battery produces a voltage drop across its internal impedance. When the current is higher, the voltage provided for the circuit to be supplied correspondingly drops. That loaded voltage is therefore lower than an idling voltage. If the operating voltage supplied by the battery is no longer sufficient for proper operation of the mobile transceiver, the device is switched off.

In mobile telephones, a power output stage generating the transmitted signal used for radiation can be connected directly, i.e. without buffering, together with other circuit units of the mobile telephone, to the battery. The other loads can be digital circuits such as microcontrollers, digital signal processors, reference clock generators, etc. Due to digital system control, switching-off as a result of inadequate supply voltage is determined by those last-mentioned loads. Current consumed additionally due to the higher transmitting power, and an additional voltage drop generated as a result across the internal impedance of the battery, causes the device to be switched off earlier. A nominal power of the mobile telephone is individually calibrated during production.

It is a problem that the battery is rapidly discharged, especially with a high transmitting power, and a telephone call can be abruptly terminated by the automatic switching-off control without the operator being able to react with sufficient speed. That restricts the ease of operation and the possible uses of such mobile telephones.

SUMMARY OF THE INVENTION

It is accordingly an object of the invention to provide a circuit configuration for controlling the transmitting power of a battery-operated transceiver, which overcomes the hereinafore-mentioned disadvantages of the heretofore-known devices of this general type so that operating time is longer.

With the foregoing and other objects in view there is provided, in accordance with the invention, a circuit configuration for controlling the transmitting power of a battery-operated transceiver. The circuit configuration comprises a battery for providing a supply voltage. A power stage is provided for controllable amplification of a radio-frequency signal. A comparison device has an input side for receiving a reference signal and a signal coupled to the supply voltage. The comparison device also has an output side for supplying a difference signal. A control device is provided for controlling the gain of the power stage in dependence on the difference signal.

In a circuit configuration according to the invention, the transmitting power of the transceiver is reduced in dependence on the battery voltage. For this purpose, the nominal value of the power control is lowered in dependence on the battery voltage. If a telephone call is made at the end of the battery charge in a mobile transceiver having such a circuit configuration, the availability of the battery is extended due to two effects. On one hand, the availability is extended due to the reduced power consumption so that less current is drawn from the battery and, as a result, sufficient battery charge is available longer with a given capacity. On the other hand, the availability is extended due to the reduced voltage drop across the internal impedance of the battery due to the lower load current so that the switching-off of the device is delayed.

In the circuit according to the invention, the reduction in power is achieved through the use of analog circuit measures. Only relatively few additional components are required which can be included inexpensively in one of the integrated circuits of the transceiver. No digital computing effort is required so that the remaining digital system control of the circuit is not influenced with additional computing effort. The power control operates continuously so that the reduction in power ensures that the device can stay in operation as long as possible and with the largest possible power. Therefore, the duration of a telephone call currently made with a low battery charge is extended as far as possible.

In accordance with a concomitant feature of the invention, a signal which is generated by a voltage divider connected to the battery voltage is compared with a reference signal and a difference signal is generated. The power of the power output stage is controlled in dependence on this difference signal. The difference signal is subtracted from a predetermined constant nominal value. This corrected nominal value, in turn, is compared with a signal representing the transmitting power so that the difference signal being obtained directly controls the driver stages of the output stage. The transmitting power can be determined, for example, by a conventional directional coupler and a detector diode. The correction of the nominal value for the transmitting power is only activated when the loaded battery voltage being delivered is below the threshold value mentioned initially. A preferred embodiment of the invention is in the field of mobile telephones which are constructed for current and future cellular digital mobile telephone networks.

Other features which are considered as characteristic for the invention are set forth in the appended claims.

Although the invention is illustrated and described herein as embodied in a circuit configuration for controlling the transmitting power of a battery-operated transceiver, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 3:
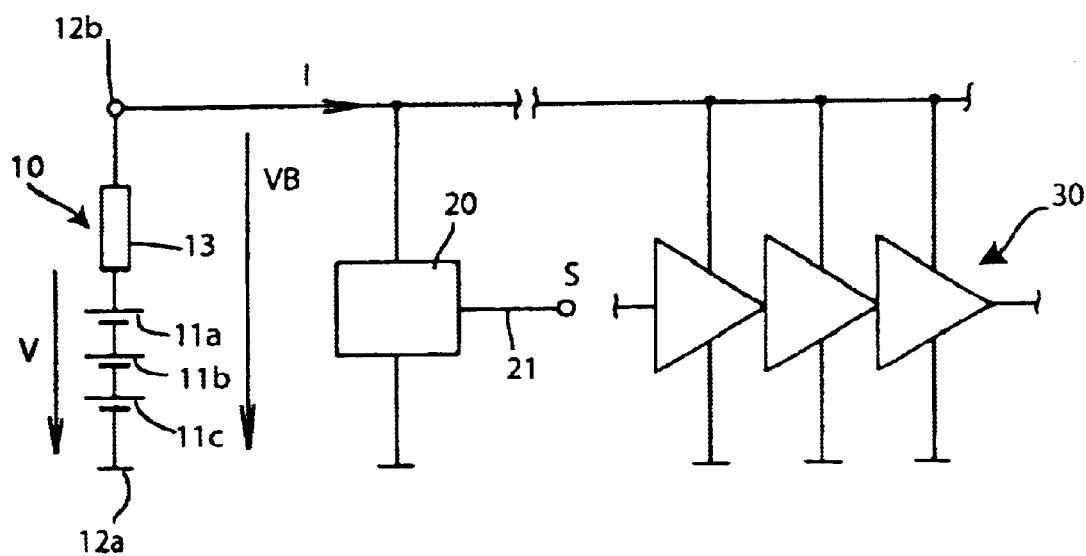
FIG. 3 is a basic schematic and block diagram of a battery of a mobile transceiver with connected loads.

Referring now to the figures of the drawings in detail and first, particularly, to FIG. 3 thereof, there is seen a circuit having a battery 10 which includes three battery cells 11a, 11b and 11c that are connected in series. A voltage V is impressed by the three battery cells 11a, 11b, 11c. The voltage V drops as the discharging of the battery increases. The battery cells 11a, 11b and 11c are connected in series inside the battery with an internal impedance 13. An operating voltage VB which supplies the mobile transceiver is present at terminals 12a and 12b. A correspondingly high voltage is dropped across the internal impedance 13 depending on a current I drawn from the battery. The operating voltage VB loaded by the current consumption in the device is obtained from the cell voltage V minus the voltage drop generated by the operating current I across the impedance 13. The higher the operating current I, the lower the loaded operating voltage VB, with the cell voltage V remaining the same. Moreover, with increasing discharging of the battery cells, the cell voltage V delivered by them also decreases.

The operating voltage VB supplies all functional units of the mobile transceiver. These functional units include digital circuit parts 20, for example microcontrollers, digital signal processors, clock generators, etc. Voice signals digitally processed by these circuits are radiated through a radio-frequency output stage 30. In the illustrated exemplary embodiment, the power output stage 30 is formed of three individual series-connected amplifiers. The power output stage 30 is also fed from the battery voltage VB. As the transmitting power of the output stage 30 becomes higher, the current I drawn from the battery increases. The supply voltage VB for the digital circuit parts 20 then drops. The microcontroller contains suitable circuits, through the use of which the operating voltage VB is interrogated. If the operating voltage VB drops below a threshold value, this is detected by the microcontroller and a switching-off signal S is generated at a terminal 21. The consequence thereof is that the mobile transceiver is switched off since it is no longer guaranteed that the functional units of the mobile transceiver, especially the digital circuit parts, operate sufficiently reliably.

The circuit shown in FIG. 3 is used to delay the switching-off of the mobile telephone as long as possible during a long conversation at high transmitting power. The circuit reduces the variable part of the power consumption of the mobile telephone, namely the transmitting power. As a result, the current I drawn from the battery and, correspondingly, the voltage drop across the internal impedance 13 of the battery drop, so that the loaded operating voltage VB increases and delays the generation of the switching-off signal S by the digital circuits 20. The GSM (global system for mobile communication) standard for digital cellular mobile telephones makes it possible to reduce the transmitting power under extreme conditions, for example when the battery charge approaches depletion.

Figure 1:
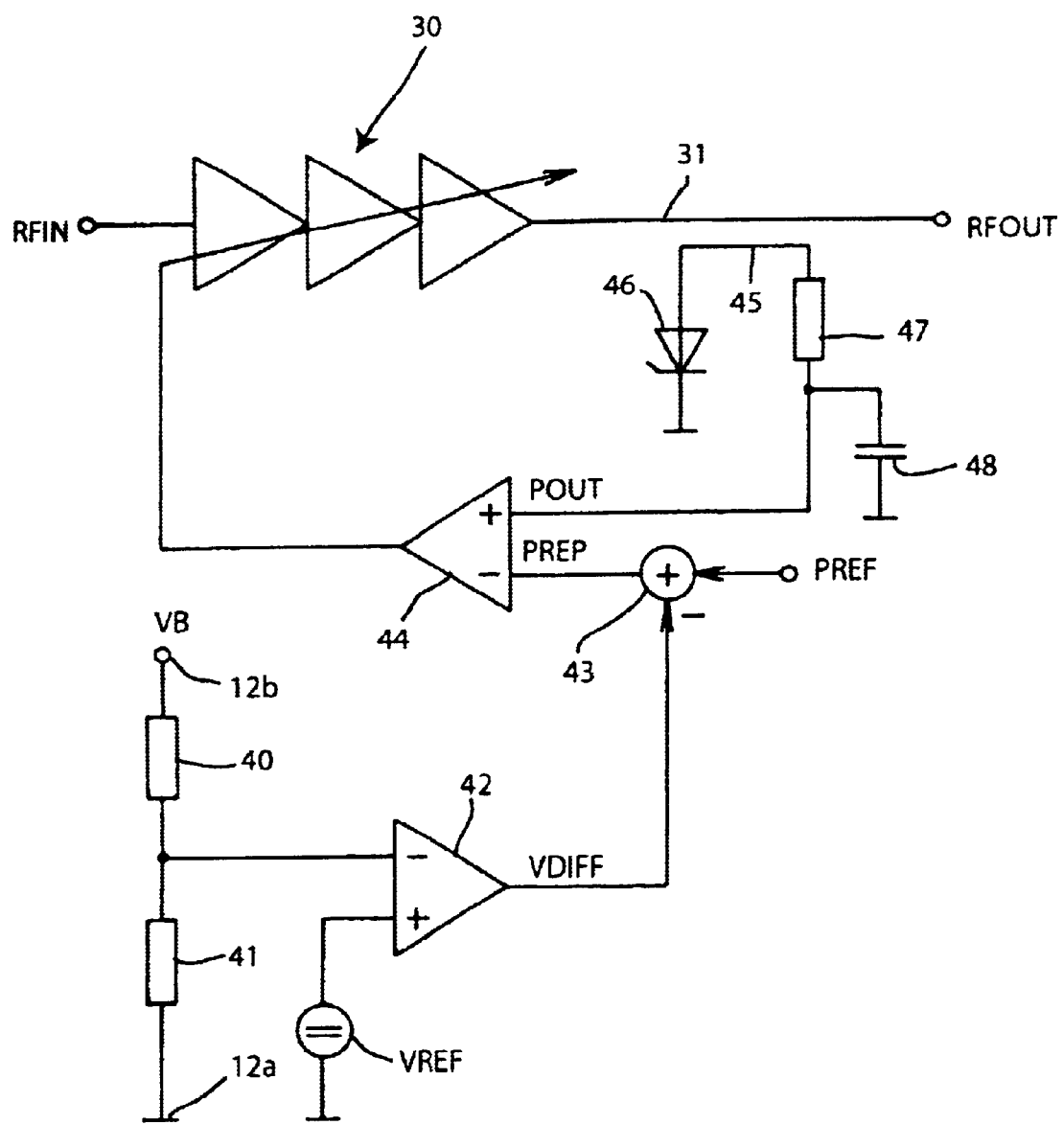
FIG. 1 is a schematic diagram of a circuit configuration according to the invention.

The circuit shown in FIG. 1 interrogates the loaded battery voltage VB provided for supplying the mobile telephone and generates a difference signal VDIFF referred to a reference voltage VREF. The difference signal VDIFF is used for correcting a predetermined nominal power signal PREF. The nominal power PREF is predetermined by device control in accordance with transmitting and receiving conditions. The nominal transmitting power is usually programmed individually for the device during the production of the mobile telephone. Finally, a corrected nominal power PREF' is used for controlling the power of the controllable radio-frequency output stages 20.

In detail, the circuit of FIG. 1 is configured as follows: A voltage divider 40, 41 is connected between terminals 12a and 12b of the operating voltage VB supplied by the battery. The output of the voltage divider 40, 41, i.e. a circuit node located between resistors 40, 41, is connected to a negative input of a comparator 42. A positive input of the comparator 42 is fed with the fixed reference voltage VREF which is independent of the fluctuations of the operating voltage. Many circuits for providing a supply-voltage-independent constant voltage are known. The difference signal VDIFF which is available at an output of the comparator 42 specifies the amount by which the supply voltage VB is below the reference voltage VREF. The difference signal VDIFF is supplied negatively to an input of an adder 43. The signal PREF representing the nominal power is fed in at another input of the adder 43. An output of the adder 43 supplies the signal PREF' which represents a nominal power that is corrected in accordance with the dropping of the supply voltage VB below the reference voltage VREF. The signal PREF' is supplied to a negative input of another comparator 44. A signal POUT which is fed at a positive input of the comparator 44 is a measure of a radio-frequency output power delivered by the power stage 30. In order to generate the signal POUT, a coupling element 45 is provided which is coupled to an output 31 of the last stage of the power amplifier output stage 30. Coupling the radio frequency into the coupling element 45 generates a voltage referred to ground across a Schottky diode 46. The Schottky diode 46 is used to determine the radio frequency amplitude of the signal which is present at a gate of the coupling element 45 that detects the wave moving away. Changes in the output power can be measured across a resistance 47. The resistance 47 is connected into a signal line leading to the positive input of the comparator 44. The resistance 47 is additionally connected to ground through a capacitor 48 to produce RC low-pass filtering. The output signal of the comparator 44 is used for controlling the power of the output stage 30. An input of this stage is supplied with a radio-frequency signal RFIN which is amplified in the power stage 30 and is delivered as output signal RFOUT in order to be radiated through the antenna of the mobile telephone.

Figure 2:
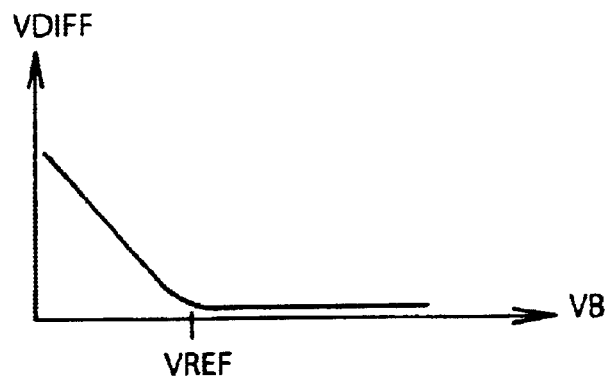
FIG. 2 is a graph showing a characteristic of a comparator of the circuit of FIG. 1.

In principle, the comparator 42, which compares the battery voltage VB with the reference voltage VREF, has the characteristic shown in FIG. 2. When the loaded battery voltage VB is above the reference voltage VREF, the output signal VDIFF of the comparator 42 is zero. This means that the corrected nominal value for the output power signal PREF' is equal to the predetermined nominal value of the signal PREF. In the case of a high available battery voltage VB, the power output stage 30 is fully driven in accordance with the requirements of the given situation. If the available battery voltage VB is below the reference voltage VREF, the difference signal VDIFF generated at the output of the comparator 42 is different from zero in the positive direction. There is then suitably a linear relationship between the operating voltage VB and the difference voltage VDIFF as shown in FIG. 2. This means that as the battery voltage VB drops (VB<VREF), the difference voltage VDIFF rises toward positive values along a straight line. The effect is that the corrected nominal value of the output power PREF' is reduced as compared with the nominal value PREF provided by the circuit. The transmitting power of the output stage 30 is correspondingly set to be lower by the same amount. As a consequence, the current I drawn from the battery drops so that the supply of battery charge is consumed less rapidly. Moreover, the voltage dropping across the internal impedance 13 of the battery decreases so that the operating voltage VB increases and the switching-off of the device by the digital circuits 20 is delayed. In this manner, the call currently made by the user of the mobile telephone is extended. The lower the operating voltage VB becomes due to the battery charge approaching depletion, the lower the transmitting power output by the power output stage 30 is set. Advantageously, this keeps the call duration as long as possible with the highest possible transmitting power. However, this extension is at the cost of a higher bit error rate due to the lower transmitting power which, however is more than balanced by the advantage achieved. This solution is compatible with the GSM standard which provides for a reduction in power.

The proposed circuit measures operate in an analog manner and do not interfere with the digital control of the microcontroller of the mobile telephone. The small number of additional components 40, 41, 42, 43 can be easily accommodated in the integrated circuit setting the transmitting power. The additional circuit expenditure will, therefore, scarcely increase the production costs of the chip set for mobile telephones.

I claim:

1. A circuit configuration for controlling the transmitting power of a battery-operated transceiver, the circuit configuration comprising:
    a battery for providing a supply voltage;
    a power stage for controllable amplification of a radio-frequency signal, said power stage having a gain;
    a comparison device, said comparison device having an input side for receiving a reference signal and a signal coupled to the supply voltage, said comparison device having an output aide for supplying a difference signal, said comparison device:
        outputting the difference signal with a zero-amplitude, when an amplitude of the signal coupled to the supply voltage is above an amplitude of the reference signal;
        outputting the difference signal with an amplitude different from the zero-amplitude of the difference signal in the positive direction, when the amplitude of the signal coupled to the supply voltage lies below the amplitude of the reference signal;
    a control device for controlling the gain of said power stage in dependence on the difference signal; and
    a digitally operating functional unit supplied by the supply voltage, said functional unit generating a switching-off signal in dependence on the supply voltage for switching off the transceiver.

2. The circuit configuration according to claim 1, wherein said control device includes a logic element for generating a difference between the difference signal and a further reference signal, said logic element having an output for supplying a control signal to be supplied to said power stage for controlling the gain of said power stage.

3. The circuit configuration according to claim 1, including a voltage divider having an input side connected between terminals for the supply voltage and an output side connected to an input of said comparison device.

4. The circuit configuration according to claim 2, wherein said control device includes a measuring device for measuring power of a signal output by said power stage and a further comparison device, said further comparison device having an input side coupled to an output of said measuring device and to the output of maid logic element, and said further comparison device having an output side for supplying the control signal for controlling power of said power stage.

5. The circuit configuration according to claim 4, wherein said measuring device includes a directional coupler having a coupling element coupled to an output of said power stage, an element connected to said coupling element for detecting a radio-frequency amplitude, and a resistor connected between said coupling element and an input of said further comparison device.

6. The circuit configuration according to claim 5, wherein said coupling element detects a wave moving away from said power stage and has a gate, and said element detecting the radio-frequency amplitude is a Schottky diode connected to the gate of said coupling element.

7. A circuit configuration for controlling the transmitting power of a battery-operated transceiver in a mobile telephone for operation in a cellular telephone network, the circuit configuration comprising:
    a battery for providing a supply voltage;
    a power stage for controllable amplification of a radio-frequency signal, said power stage having a gain;
    a comparison device, said comparison device having an input side for receiving a reference signal and a signal coupled to the supply voltage, and said comparison device having an output side for supplying a difference signal, said comparison device:
        outputting the difference signal with a zero-amplitude, when an amplitude of the signal coupled to the supply voltage is above an amplitude of the reference signal;
        outputting the difference signal with an amplitude different from the zero-amplitude of the difference signal in the positive direction, when the amplitude of the signal coupled to the supply voltage lies below the amplitude of the reference signal;
    a control device for controlling the gain of said power stage in dependence on the difference signal; and
    a digitally operating functional unit supplied by the supply voltage, said functional unit generating a switching-off signal in dependence on the supply voltage for switching off the transceiver.

* * * * *